(12) United States Patent
Feng et al.

(10) Patent No.: US 7,545,169 B1
(45) Date of Patent: Jun. 9, 2009

(54) FPGA ARCHITECTURE HAVING TWO-LEVEL CLUSTER INPUT INTERCONNECT SCHEME WITHOUT BANDWIDTH LIMITATION

(75) Inventors: Wenyi Feng, Sunnyvale, CA (US); Sinan Kaptanoglu, Belmont, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/173,225

(22) Filed: Jul. 15, 2008

Related U.S. Application Data

(63) Continuation of application No. 11/855,974, filed on Sep. 14, 2007, now Pat. No. 7,408,383.

(60) Provisional application No. 60/825,872, filed on Sep. 15, 2006.

(51) Int. Cl.
*H01L 25/00* (2006.01)
*H03K 19/177* (2006.01)

(52) U.S. Cl. .................. 326/41; 326/47; 326/113

(58) Field of Classification Search ............ None
See application file for complete search history.

(56) References Cited

U.S. PATENT DOCUMENTS

| 6,292,019 | B1 | 9/2001 | New et al. | |
|---|---|---|---|---|
| 6,556,042 | B1 | 4/2003 | Kaviani | |
| 6,759,869 | B1 * | 7/2004 | Young et al. | 326/41 |
| 7,408,383 | B1 | 8/2008 | Feng et al. | |

OTHER PUBLICATIONS

Betz, Vaughn et al., "Cluster-Based Logic Blocks", Chapter 6, in Architecture and CAD for Deep-Submicron FPGAs, 1999, second printing 2000, pp. 137-141, Kluwer Academic Publishers, Norwell, MA, USA.

Feng, Wenyi et al., "Designing Efficient Input Interconnect Block for LUT Clusters Using Counting and Entropy", Proceedings of the 2007 ACM/SIGDA 15th international symposium on Field-programmable gate arrays, Feb. 20-22, 2007 held in Monterey, CA, pp. 23-32, ACM, New York, NY, USA.

Lemieux, Guy, "Sparse Crossbar Design", Chapter 4, in Design of Interconnection Networks for Programmable Logic, 2004, pp. 77-79, Kluwer Academic Publishers, Norwell, MA, USA.

Lewis, David et al., "The Stratix II Logic and Routing Architecture", Proceedings of the 2005 ACM/SIGDA 13th international symposium on Field-programmable gate arrays, Feb. 20-22, 2005 held in Monterey, CA, pp. 14-20, ACM, New York, NY, USA.

* cited by examiner

*Primary Examiner*—Anh Q Tran
(74) *Attorney, Agent, or Firm*—Lewis and Roca LLP

(57) ABSTRACT

An interconnect architecture for a programmable logic device comprises a plurality of interconnect routing lines. The data inputs of a plurality of first-level multiplexers are connected to the plurality of interconnect routing lines such that each interconnect routing line is connected to only one multiplexer. A plurality of second-level multiplexers are organized into multiplexer groups. Each of a plurality of lookup tables is associated with one of the multiplexer groups and has a plurality of lookup table inputs. Each lookup table input is coupled to the output of a different one of the second-level multiplexers in the one of the multiplexer groups with which it is associated. The data inputs of the second-level multiplexers are connected to the outputs of the first-level multiplexers such that each output of each first-level multiplexer is connected to an input of only one second-level multiplexer in each multiplexer group.

6 Claims, 4 Drawing Sheets ically needs to spread to have more cells, taking a larger chip area. Accordingly, it would be desirable to provide an interconnect scheme that is both area-efficient and without bandwidth limitation.

FPGA ARCHITECTURE HAVING TWO-LEVEL CLUSTER INPUT INTERCONNECT SCHEME WITHOUT BANDWIDTH LIMITATION

CROSS-REFERENCE TO RELATED APPLICATIONS

This application is a continuation of U.S. patent application Ser. No. 11/855,974, filed Sep. 14, 2007, now issued as U.S. Pat. No. 7,408,383, which claims priority to U.S. Provisional Patent Application Ser. No. 60/825,872, filed Sep. 15, 2006, both of which are incorporated by reference as if set forth herein.

BACKGROUND OF THE INVENTION

1. Field of the Invention

The present invention relates to field programmable gate array (FPGA) architectures. More specifically, the invention relates to an area efficient interconnect scheme for a cluster based FPGA architecture that connects inter-cluster routing tracks to the inputs of look-up tables (or other logic cells) in the cluster.

2. The Prior Art

A cluster architecture is a type of FPGA architecture in which the basic repeating layout tile is a cluster. The cluster is an aggregation of logic blocks and routing multiplexers. Usually, a limited number of inputs are provided into the cluster in order to save area. A routing multiplexer is a basic FPGA routing element with multiple inputs and one output. It can be programmed to connect one of its inputs to the output. The number of inputs to the routing multiplexer is called the multiplexer size. A crossbar is equivalent to M multiplexers with each multiplexer selecting an output from a subset of N inputs. An N×M crossbar connects N different inputs to M outputs. If the N inputs are drawn as N horizontal wires, and M outputs vertical wires, there are N*M crosspoints, with each one representing a possible input-output connection. The number of connections (or switches) in a crossbar is the number of provided connections. A fully populated crossbar has N*M connections. A p % sparsely populated crossbar has (NM*p %) connections.

A cluster input interconnect scheme is an interconnect network that connects inter-cluster routing tracks to inputs of lookup tables (LUTs) (or other logic cells). It usually consists of multiplexers. Depending on the number of multiplexers that a routing track signal needs to pass through to reach LUT inputs, it could be classified as a one-level scheme or a two-level scheme. Depending on the number of unique signals that may be routed to the LUT inputs simultaneously, it could be classified as "having input bandwidth limitation" or "not having input bandwidth limitation." Usually, one-level schemes do not have input bandwidth limitation, while two-level schemes exhibit input bandwidth limitation.

A one-level input interconnect scheme is a scheme that connects the routing tracks directly to the logic cells or LUT input multiplexers and usually has no bandwidth limitation. This scheme has been used, for example, in FPGAs available from Xilinx of San Jose, Calif. An illustrative example of such a scheme is shown in FIG. 1. This scheme takes signals from a plurality of T input tracks 10-1 through 10-T. A plurality of M input signals on lines 12-1 through 12-M are programmably connected to the inputs of multiplexers 14-1 through 14-P through an interconnect matrix 16 including programmable interconnect elements. There are numerous kinds of programmable interconnect elements as is known in the art.

The outputs of multiplexers 14-1 through 14-P each feed an input of one of N LUTs identified by reference numerals 18-1 through 18-N. Each of LUTS 18-1 through 18-N has multiple inputs. Let S be the number of inputs of the LUT, or LUT size (for example, S=4 for 4 input LUT). Therefore, the number of input multiplexers P=S*N (total number of LUT inputs for N LUTs). The number of input signals M<=P*MUX size, since each input signal is allowed to fan out to more than 1 input MUX. Finally, the number of routing tracks T>=M.

Architectures of the type shown in FIG. 1 are usually not bandwidth limited in that the total number of input signals that are provided is at least equal to or (more often) considerably larger than the total number of multiplexer inputs; i.e. M>=P.

A two-level input interconnect scheme is a scheme that connects the routing tracks first to inputs of first-level multiplexers. The outputs of the first-level multiplexers are connected to inputs of LUT input multiplexers (or second-level multiplexers). The two-level input interconnect scheme includes first and second stage crossbars.

An example of a two-level input interconnect scheme is shown in FIG. 2. As in the scheme shown in FIG. 1, the two-level interconnect scheme shown in FIG. 2 takes signals from a plurality of T input tracks 10-1 through 10-T. A plurality of M input signals are connected to the inputs of first-level multiplexers 14-1 through 14-10 using an interconnect matrix crossbar 16. Multiplexers 14-1 through 14-10 are shown each having sixteen inputs.

The outputs of the first-level multiplexers 14-1 through 14-10 are connected to the inputs of P (P=16) second-level multiplexers 18-1 through 18-16 using an interconnect matrix crossbar 20. The outputs of multiplexers 18-1 through 18-16 each feed an input of one of N LUTs (N=4) identified by reference numerals 24-1 through 24-4. Each of LUTs 24-1 through 24-4 has S inputs. As in FIG. 1, the number of second-level multiplexers P=S*N. The number of first-level multiplexers 14-1 through 14-10 is K=(S*(N+1)/2). Also, as in FIG. 1, the number of first multiplexer input signals M<=K*MUX size, since each input signal is allowed to fan out to multiple first-level MUXes. And the number of routing tracks T>=M.

Prior-art two-level schemes have bandwidth limitations. The bandwidth limitation comes from the fact that the number of first-level MUXes K (=(S*(N+1)/2)) is smaller than the number of LUT input MUXes P (=S*N), which means that N LUTs (i.e., S*N LUT inputs) have to share at most K unique input signals. The bandwidth limitation is necessary to make the scheme area efficient. There are many publications discussing how large the bandwidth limitation should be. For four-input LUTs, a type of logic block commonly used in FPGAs, the limitation on the number of unique signals going into a cluster simultaneously is generally accepted to be 4*(N+1)/2=2N+2, where N is the number of four-input LUTs in a cluster.

An input bandwidth limitation is the number of unique routing track signals that can be simultaneously routed to the LUT inputs through a cluster input interconnect. A cluster of N LUTs each having S inputs could need S*N unique signals in the worst case. If the number of unique input signals (out of M available to the cluster) that can be simultaneously routed to the LUT inputs is smaller than S*N, then it is said that the cluster (or the cluster input interconnect) has input bandwidth limitation. Otherwise, the cluster (or the cluster input interconnect) has no bandwidth limitation.

The bandwidth limit imposes a hard constraint in clustering, i.e., if the number of unique external signals required by the cells in the cluster exceeds the bandwidth limit, the cluster is not routable. Such a scheme has been used in academia (VPR-type architecture). A VPR-type architecture is an FPGA architecture popular in academia that is based on LUT clusters. The cluster input scheme in VPR-type architecture is a two-level scheme with bandwidth limitation $S*(N+1)/2$. The first interconnect crossbar is usually sparsely populated, and the second interconnect crossbar is assumed to be fully populated. A VPR-type architecture usually assumes full population in the second crossbar, which is very area expensive.

Such a scheme has also been used in FPGAs available from Altera Corp. of San Jose, Calif. Commercial products like the Stratix line of products from Altera use 50% connection population in the second crossbar.

Researchers have studied the depopulation of two-level interconnect schemes by looking into each stage separately. The research has concluded that having $K>=S*N$ number of first-level MUXes in such a scheme (i.e., no bandwidth limitation, or allowing all LUT inputs to have unique input signal) is excessive and therefore a waste of resources. On the other hand, at least one article has indicated that an $M=K*MUX$ size depopulation scheme provides poor routability (see Guy Lemieux and David Lewis. *Design of Interconnection Networks for Programmable Logic*. Kluwer Academic Publishers, 2004 ("Lemieux and Lewis")).

In the prior art, the Monte Carlo method is used for measuring routability. This method picks a large number of random routing vectors, and measures the percentage of them that can be routed on a routing structure. The obtained percentage measures the routability of the routing structure, and can be used to guide iterative improvement of the connectivity in the routing structure. This method can only be used for a one-level crossbar.

BRIEF DESCRIPTION OF THE INVENTION

An interconnect architecture for a programmable logic device comprises a plurality of interconnect routing lines. The data inputs of a plurality of first-level multiplexers are connected to the plurality of interconnect routing lines such that each interconnect routing line is connected to only one multiplexer. A plurality of second-level multiplexers are organized into multiplexer groups. Each of a plurality of lookup tables is associated with one of the multiplexer groups and has a plurality of lookup table inputs. Each lookup table input is coupled to the output of a different one of the second-level multiplexers in the one of the multiplexer groups with which it is associated. The data inputs of the second-level multiplexers are connected to the outputs of the first-level multiplexers such that each output of each first-level multiplexer is connected to an input of only one second-level multiplexer in each multiplexer group.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 3:
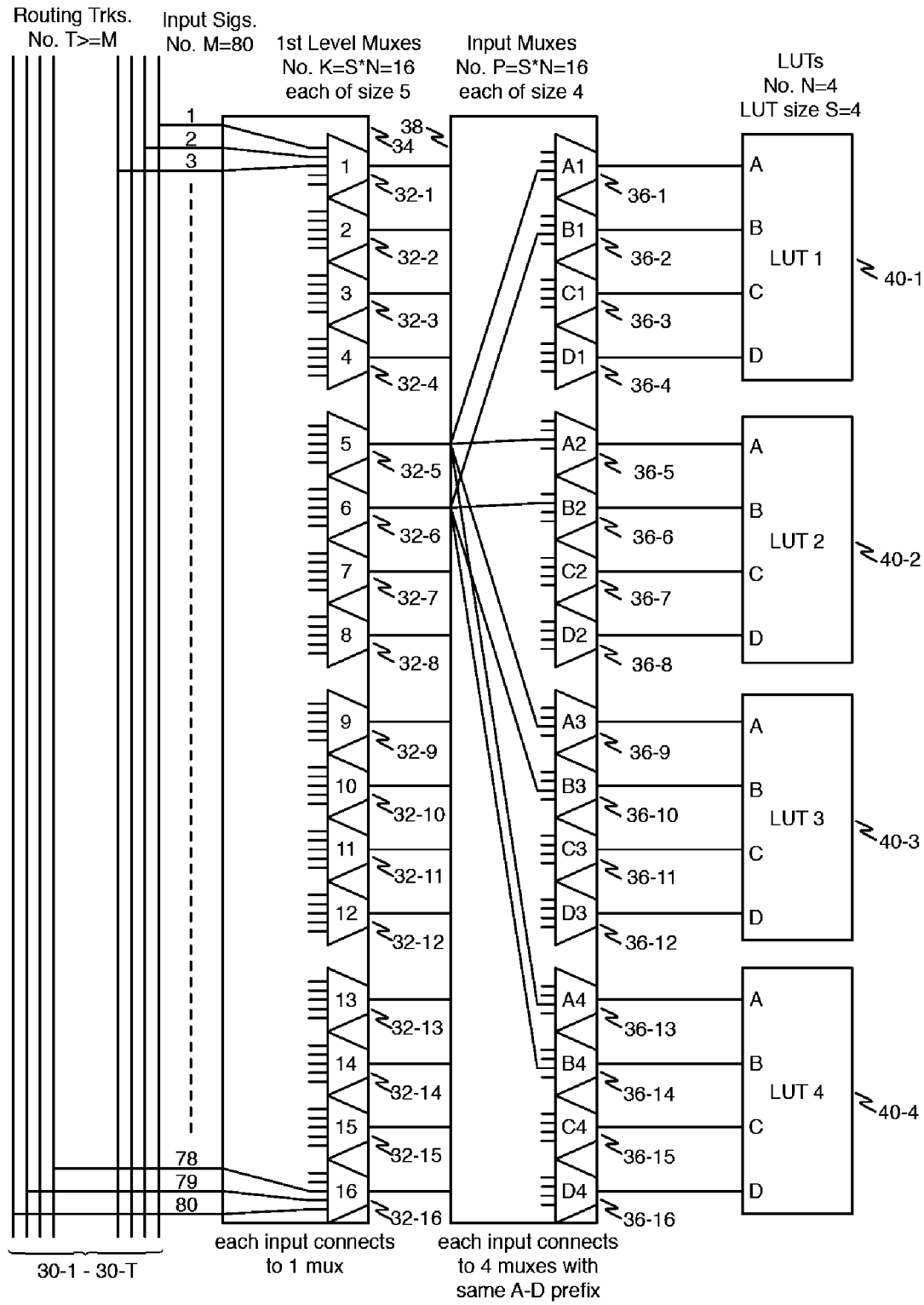
FIG. 3 is a block diagram of an illustrative two-level interconnect scheme according to the present invention.

An illustrative embodiment of the present invention as shown in FIG. 3 includes an interconnect scheme for routing tracks to inputs of logic cells in a cluster-based programmable logic architecture that has two multiplexer levels. The interconnect scheme of the present invention has no bandwidth limitation; that is, a unique signal can be brought in for every logic cell input. In another embodiment the architecture may have a limited bandwidth limitation that is greatly reduced compared to the prior art.

Referring now to FIG. 3, a block diagram shows an illustrative example of a two-level input interconnect scheme according to the present invention. As in the schemes shown in FIGS. 1 and 2, the two-level interconnect scheme takes signals from a plurality of T input tracks 30-1 through 30-T. A plurality of M (M=80) input signals are connected to the inputs of K (K=16) first-level multiplexers 32-1 through 32-16 using an interconnect matrix crossbar 34.

The outputs of the first-level multiplexers 32-1 through 32-16 are connectable to the inputs of P (P=16) second-level multiplexers 36-1 through 36-16 using an interconnect matrix crossbar 38. The outputs of multiplexers 36-1 through 36-16 each feed an input of one of N (N=4) LUTs identified by reference numerals 40-1 through 40-4. Each of LUTS 40-1 through 40-4 has S (S=4) inputs.

Figure 1:
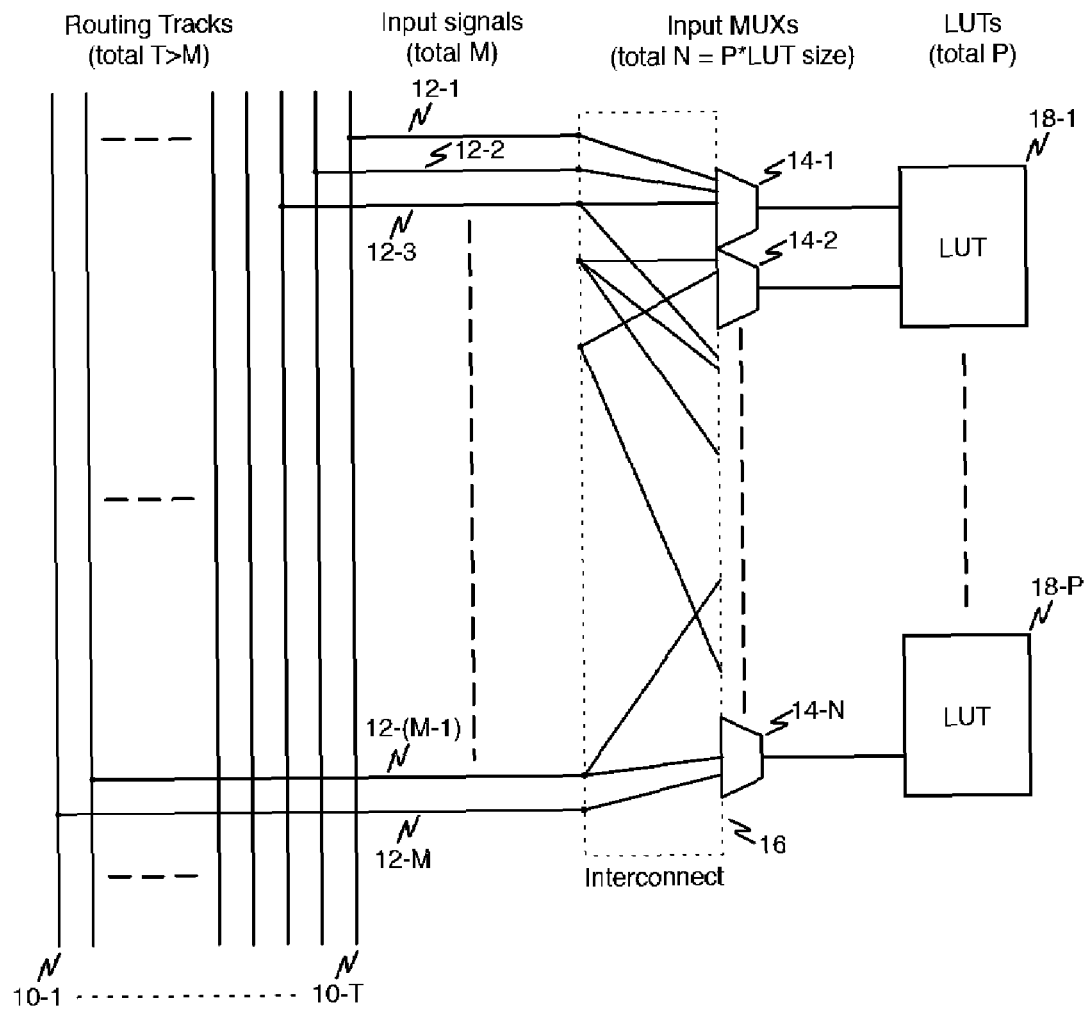
FIG. 1 is a block diagram of a single-level prior-art interconnect scheme.
Figure 2:
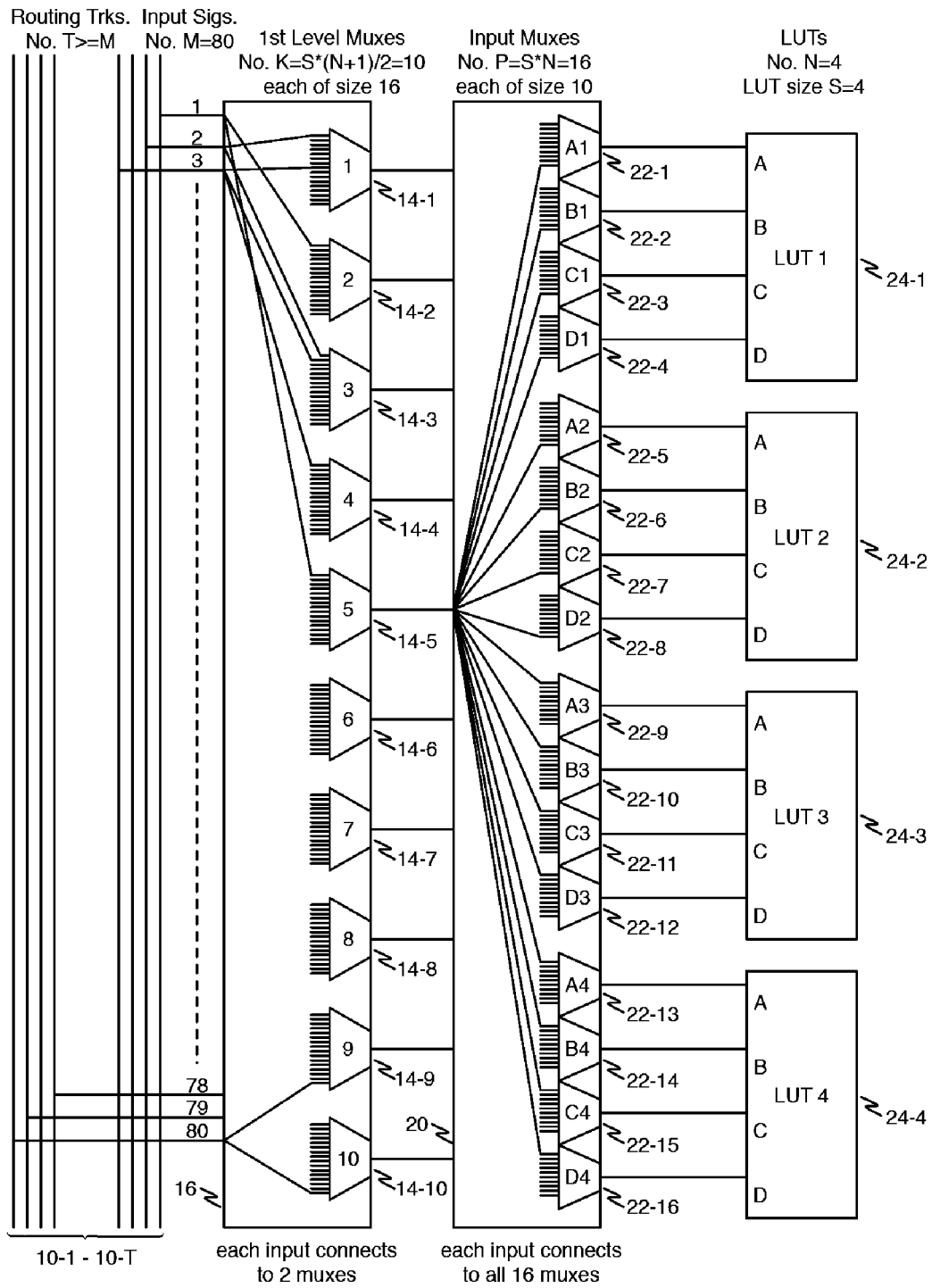
FIG. 2 is a block diagram of a two-level prior-art interconnect scheme.

As in FIGS. 1 and 2, the number of second-level multiplexers $P=S*N$. Also, as in FIGS. 1 and 2, the number of first multiplexer input signals $M<=N*MUX$ size. The number of input tracks $T>=M$.

While FIG. 3 appears to be similar to FIG. 2, there are key differences that result in the advantages provided by the present invention. The number K of first-level multiplexers 32-1 through 32-16 is $K>=(S*N)$.

There is no bandwidth limitation in the scheme shown in FIG. 3 because the number of first-level multiplexers 32-1 through 32-16 is at least as large as the number of input multiplexers $P=S*N$. This allows up to K inputs signals coupled to the second-level multiplexers, which, in turn, allows each of the $S*N$ LUT inputs connected to a unique input signal. In another embodiment, the number of first-level multiplexers is approximately the number of input multiplexers.

Area efficiency is achieved by depopulation in the interconnects between routing tracks and the first-level multiplexers (the first stage interconnect) as well as between the first and second-level multiplexers (the second stage interconnect). One of many possible depopulation schemes could be used in each stage as described in more detail herein. One important element of an embodiment of the invention is to determine the depopulation schemes and the parameters for the depopulation schemes for the first and second stages in conjunction with each other to assure an efficient architecture with little or no bandwidth limitation. The two sets of routing interconnects are jointly designed to implement the desired connectivity efficiently, i.e., the depopulation schemes are jointly optimized to minimize area and maximize routability.

One way to depopulate the first stage interconnect is to have just M switches in the interconnect (so the population is 1/K). Each of the M inputs is connected to just one of the first-level MUXes. This is the sparsest depopulation one can do if one still wants all M input signals to be connectable. In this case, an M=K*MUX depopulation scheme is able to be employed, although it was not considered to be usable in the prior art (see Lemieux and Lewis). The second stage interconnect is depopulated to have 1/S depopulation by partitioning first stage MUX outputs into S subgroups, with each subgroup driving one input mux (out of S) of each LUT.

The present invention provides an advantage over a one-level scheme is that it achieves better routability with a smaller number of switches. It can be used in large clusters where one-level scheme would be too inefficient. The present invention also provides an advantage over a prior-art two-level scheme in that it does not have bandwidth limitation, thus software (e.g., place and route software) is free from such constraint. With a higher number of second-level multiplexers, aggressive depopulation of both the first crossbar and the second crossbar may be implemented while still achieving good routability.

An illustrative way to build the two-level interconnect of the present invention is presented herein. However, other schemes and enhancements are also possible. For example, both crossbars may be more populated than what is shown in FIG. 3. The crossbar between the first-level and second-level multiplexers may be populated up to about twice what is shown in FIG. 3, along with increasing the number of inputs in the second-level multiplexers. If the population of the second crossbar was doubled, the number of inputs to the second-level multiplexers would also be doubled. Likewise, the population of the first crossbar may also be increased up to about twice what is shown in FIG. 3 what is shown in FIG. 3, in a manner similar to that discussed for the second crossbar, with a corresponding increase in the number of inputs to the first-level multiplexers. In addition, if the cluster is large, two crossbars may be used in parallel. Further, one or more input signals may be configured to bypass the first level and go directly to the second level to provide faster timing.

One example for a four-input LUT-based cluster, is N=8 with M=160, and K=32. In the first stage interconnect each second-level multiplexer takes 5 routing tracks; i.e., each routing track only drives one second-level multiplexer. The number of connections between routing tracks and second-level multiplexers is 192. The population is 1/K (only M connections out of M*K maximal possible connections).

In the second stage interconnect the population from second-level multiplexers to LUT input multiplexers is 25%, i.e., the number of potential connections is 25% of the maximal possible value K*N*4. To be specific, each second-level multiplexers drives eight LUT input multiplexers (one for each LUT).

Contrary to the prior art assumptions and approaches, experiments have shown that the above structure shows good routability despite the depopulation. And overall connection count is smaller than even depopulated VPR-type architectures.

Figure 4:
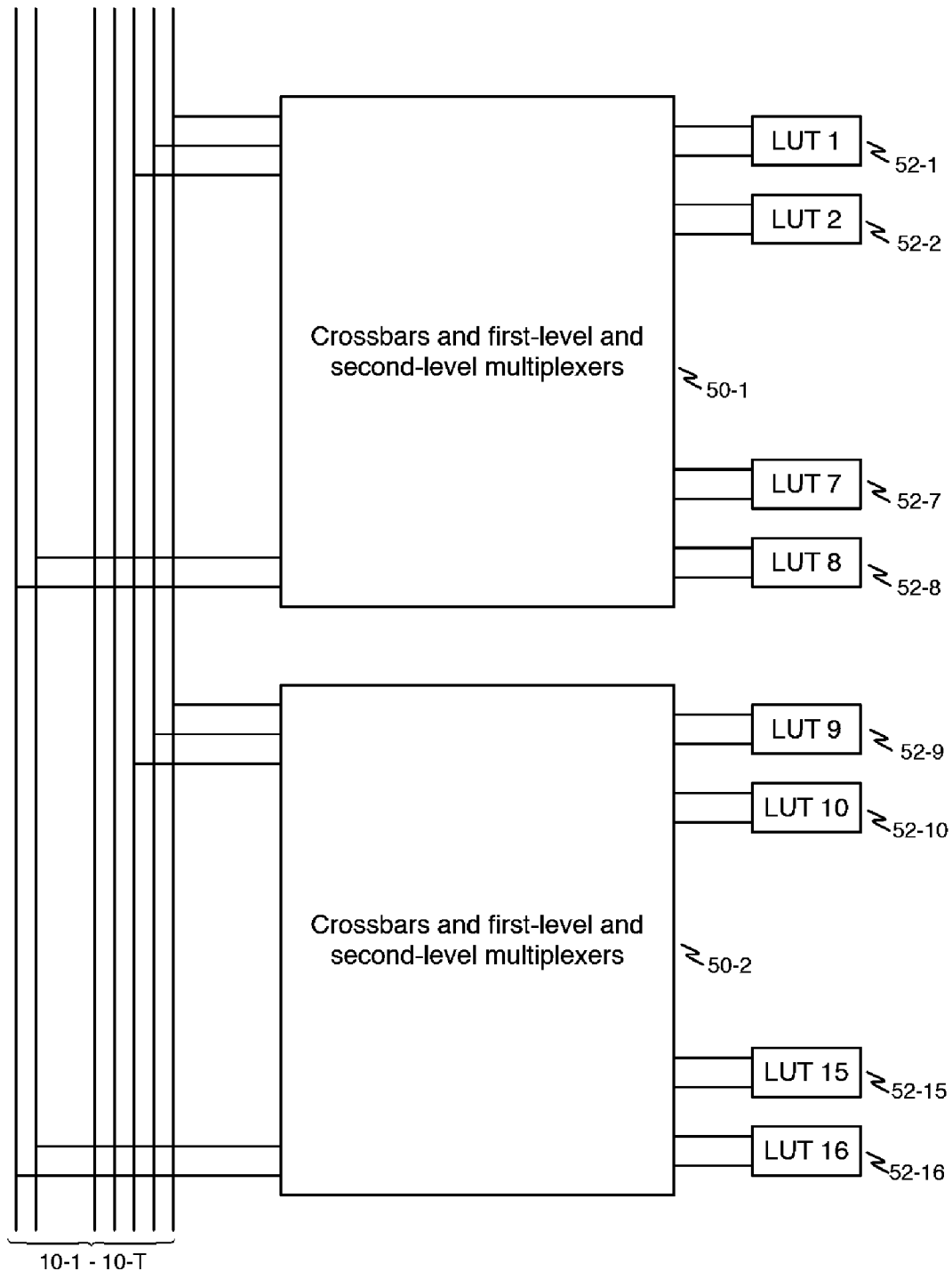
FIG. 4 is a block diagram of another illustrative two-level interconnect scheme according to the present invention.

FIG. 4 is another example that employs two such interconnect structures in parallel when the cluster is large. An illustrative example is a cluster of sixteen 4-input LUTs with 256 input routing tracks. Therefore, (M=256, k=4, N=16). There are two ways to form such a structure. First, an example using sixty-four first-level multiplexers (to guarantee no bandwidth limitation) could be employed.

In the alternative, two parallel structures could be employed, each serving half the LUTs. Such a structure is shown in FIG. 4. The M inputs each have two fan outs, one to section 50-1, and the other to section 50-2. Sections 50-1 and 50-2 are identical, except that section 50-1 drives LUTS 52-1 through 52-8 and section 50-2 drives LUTs 52-9 through 52-16. The arrangement of FIG. 4 has no bandwidth limitation. Each of sections 50-1 and 50-2 has thirty-two first-level multiplexers to guarantee no bandwidth limitation. Both crossbars take the same set of M inputs, but each only drives half of the LUTs. Each crossbar is built using the approach described above with reference to FIG. 3.

The advantage of FIG. 4 mainly applies to large clusters. It is achieved by balancing the sizes between first-level and second-level multiplexers. Suppose it is desired to build an interconnect for a cluster of sixteen 4-input LUTs with 256 incoming signals, then N=16, M=256, and K=64. If the approach of FIG. 3 is used, it would require sixty-four first level multiplexers (each with size 256/64=4), and sixty-four second-level multiplexers (each with size 64/4=16). This results in a total of 1,280 connections (64×4+64×16). There is an imbalance between the size of first-level multiplexers (which is 4) and that of second-level multiplexers (which is 16). With the approach of FIG. 4, two parallel sub-interconnects are used. Each sub-interconnect has thirty-two first level multiplexers (each with 8 inputs), and thirty-two second level multiplexers (each with 8 inputs). The number of connections in one sub-interconnect would be 512 (32×8+32×8). So the total number of connections combined is 1,024 (512×2). The size of first-level and second level multiplexers is perfectly balanced (both have 8 inputs). This saves 256 connections (20% compared with the approach of FIG. 3), while routability remains almost the same (using entropy measurement, the entropy of interconnect built using FIG. 4 approach is only 3% smaller than using the approach of FIG. 3). Entropy is discussed in Wenyi Feng and Sinan Kaptanoglu. Designing efficient input interconnect blocks for LUT clusters using counting and entropy. FPGA 2007, Feb. 18-20, 2007, Monterey, Calif. This article is incorporated herein by reference.

The area efficiency of the two alternative approaches may be calculated. If the structure is formed as a whole, (each first-level multiplexer drives 16 loads). Assuming sixty-four first-level multiplexers: Total number of switches used: 256+64×16=1,024+256=1,280; entropy of the whole unit is 346.88; entropy per switch is 0.271. If the structure is built as two-sub-units, each with 32 L1-MUXes: total number of switches used: 256×2+64×8=1,024; entropy of the entire unit is 336.77; entropy per switch is 0.329. It may be seen that the area efficiency of the second alternative is better than the first one (0.329 vs. 0.271).

In general, when cluster size is large, it is not efficient to have each first-level multiplexer fan out to all LUTs, because the second-level multiplexers will become too large, reducing area efficiency. With the approach disclosed herein, the area efficiency of different implementations can be computed and compared.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An interconnect architecture for a programmable logic device comprising:
    a plurality of interconnect routing lines;
    a plurality of first-level multiplexers each having data inputs and a data output, the data inputs of the first-level multiplexers connected to the plurality of interconnect routing lines such that each interconnect routing line is connected to at least two of the plurality of level one multiplexers;

a plurality of second-level multiplexers each having data inputs and a data output, the second-level multiplexers organized into multiplexer groups; and a plurality of lookup tables, each lookup table associated with one of the multiplexer groups and having a plurality of lookup table inputs, each lookup table input coupled to the output of a different one of the second-level multiplexers in the one of the multiplexer groups with which it is associated;

wherein the data inputs of the second-level multiplexers are connected to the outputs of the first-level multiplexers such that each output of each first-level multiplexer is connected to an input of only one second-level multiplexer in each multiplexer group.

2. The interconnect architecture of claim 1 which further comprises:

an interconnect matrix crossbar coupling data inputs from the plurality of second level multiplexers to data outputs of the plurality of first level multiplexers.

3. An interconnect architecture for a programmable logic device comprising:

a plurality of interconnect routing lines;

a plurality of first-level multiplexers each having data inputs and a data output, the data inputs of the first-level multiplexers connected to the plurality of interconnect routing lines such that each of the plurality of interconnect routing lines is connected to at least two of the plurality of level one multiplexers;

a plurality of second-level multiplexers each having data inputs and a data output, the second-level multiplexers organized into multiplexer groups; and a plurality of lookup tables, each lookup table associated with one of the multiplexer groups and having a plurality of lookup table inputs, each lookup table input coupled to the output of a different one of the second-level multiplexers in the one of the multiplexer groups with which it is associated;

wherein the number of first-level multiplexers is equal to at least the number of second-level multiplexers.

4. The interconnect architecture of claim 3 which further comprises:

an interconnect matrix crossbar coupling data inputs from the plurality of second level multiplexers to data outputs of the plurality of first level multiplexers.

5. An interconnect architecture for a programmable logic device comprising:

a plurality of interconnect lines;

a plurality of first-level multiplexers, each having a plurality of inputs and an output;

a plurality of second-level multiplexers, each having a plurality of inputs and an output; and a plurality of look up tables, each having a plurality of inputs; and wherein the plurality of first-level multiplexers is organized into groups, the plurality of second-level multiplexers is organized into groups, each group corresponding to a look up table, each input of each look up table is connected to the output of a second-level multiplexer, a first input of a first multiplexer in each group of second-level multiplexers is connected to the output of a first multiplexer in a first group of first-level multiplexers, and each input of each first level multiplexer is connected to one of the plurality of interconnect lines such that each of the plurality of interconnect routing lines is connected to at least two of the plurality of level one multiplexers.

6. The interconnect architecture of claim 5 which further comprises:

an interconnect matrix crossbar coupling data inputs from the plurality of second level multiplexers to data outputs of the plurality of first level multiplexers.

\* \* \* \* \*